(12) United States Patent
Huang

(10) Patent No.: US 11,997,872 B2
(45) Date of Patent: May 28, 2024

(54) OLED DISPLAY PANEL AND MANUFACTURING METHOD THEREOF

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Hubei (CN)

(72) Inventor: Xiaowen Huang, Hubei (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 486 days.

(21) Appl. No.: 17/293,401

(22) PCT Filed: Apr. 20, 2021

(86) PCT No.: PCT/CN2021/088316
§ 371 (c)(1),
(2) Date: May 12, 2021

(87) PCT Pub. No.: WO2022/213421
PCT Pub. Date: Oct. 13, 2022

(65) Prior Publication Data
US 2022/0328794 A1    Oct. 13, 2022

(30) Foreign Application Priority Data
Apr. 7, 2021  (CN) .......................... 202110372658.5

(51) Int. Cl.
*H10K 50/858*    (2023.01)
*H10K 50/86*    (2023.01)
(Continued)

(52) U.S. Cl.
CPC ........... *H10K 50/858* (2023.02); *H10K 59/38* (2023.02); *H10K 71/00* (2023.02); *H10K 50/865* (2023.02); *H10K 59/12* (2023.02)

(58) Field of Classification Search
CPC .... H01K 50/858; H01K 50/865; H01K 59/38; H01K 59/12; H10K 50/865
See application file for complete search history.

(56) References Cited

U.S. PATENT DOCUMENTS

| 2016/0043145 A1 | 2/2016 | Choi et al. |
| 2016/0064694 A1 | 3/2016 | Choi et al. |
| 2022/0115629 A1* | 4/2022 | Suzuki ................. H10K 50/858 |

FOREIGN PATENT DOCUMENTS

| CN | 209785979 U | 12/2019 |
| CN | 112531006 A | 3/2021 |
| CN | 113241354 A | 8/2021 |

* cited by examiner

*Primary Examiner* — Marc Anthony Armand
(74) *Attorney, Agent, or Firm* — PV IP PC; Wei Te Chung; Zhigang Ma

(57) ABSTRACT

An organic light-emitting diode (OLED) display panel and manufacturing method thereof are provided. A light convergence layer is disposed between an encapsulation layer and a color filter layer in the OLED display panel, and a light divergence layer is disposed between the color filter layer and a cover plate. Through converging light by the light convergence layer, more light passes through the color filter layer. The light passing through the color filter layer is then diverged by the light divergence layer, thereby increasing brightness and chromaticity of the OLED display panel.

13 Claims, 2 Drawing Sheets

(51) Int. Cl.
*H10K 59/12* (2023.01)
*H10K 59/38* (2023.01)
*H10K 71/00* (2023.01)

OLED DISPLAY PANEL AND MANUFACTURING METHOD THEREOF

CROSS-REFERENCE TO RELATED APPLICATIONS

This application is a 371 U.S. National Phase of International Application No. PCT/CN2021/088316, filed Apr. 20, 2021, which claims priority to Chinese Patent Application No. 202110372658.5, filed Apr. 7, 2021. The entire disclosures of the above applications are incorporated herein by reference.

FIELD OF INVENTION

The present application relates to the field of display technology and specifically to an organic light-emitting diode (OLED) display panel and manufacturing method thereof.

BACKGROUND OF INVENTION

In recent years, with development of display technology and changes in market demand, flexible screens, such as flexible organic light-emitting diode (OLED) display panels, have become a popular development trend because they have various advantages like being flexible, bendable, and self-luminescent and having quick response speed, etc.

POL-less technology as an option of OLED display panels is gaining increasingly more attention. In this option, a polarizer is replaced by a color filter (CF) layer, and a thickness of a panel can be decreased, satisfactorily presenting a flexible characteristic of OLED devices, and increasing light extraction efficiency of the panel. The CF layer consists of red, green, and blue color resists and a black matrix (BM). In an OLED display panel, red, green, and blue color resists separately attend to light emitted from corresponding red, green, and blue sub-pixel units in an emissive layer, and a black matrix mainly functions to prevent light leakage of the panel and decrease reflection of the panel.

However, this technology also has some problems: because the black matrix is disposed on the emissive layer and has a certain thickness, it inevitably blocks a part of light emitted from the emissive layer, thereby leading to worse brightness and chromaticity of the panel.

SUMMARY OF INVENTION

Embodiments of the present application provide an OLED display panel and manufacturing method thereof to deal with drawbacks of conventional POL-less technology that OLED display panels have worse brightness and chromaticity.

In a first aspect, embodiments of the present application provide an OLED display panel that includes a base plate; an emissive layer located on the base plate and including a plurality of light-emitting units; an encapsulation layer located on the emissive layer; a color filter layer located on the encapsulation layer and including a plurality of color filters, wherein the color filters are arranged in one-to-one correspondence with the light-emitting units; and a cover plate located on the color filter layer; wherein a light convergence layer is disposed between the encapsulation layer and the color filter layer, the light convergence layer is made of a light convergence material, the light convergence material has a convergent effect on light from the emissive layer, a light divergence layer is disposed between the color filter layer and the cover plate, the light divergence layer is made of a light divergence material, and the light divergence material has a divergent effect on light from the emissive layer; wherein a refractive index of the light convergence layer is greater than a refractive index of the encapsulation layer and the light divergence layer; wherein the light convergence layer includes a plurality of first micro lens structures, the first micro lens structures are arranged in one-to-one correspondence with the light-emitting units, and the first micro lens structures have at least one convex surface; and wherein the light divergence layer includes a plurality of second micro lens structures, the second micro lens structures are arranged in one-to-one correspondence with the light-emitting units, and the second micro lens structures have at least one convex surface.

In some embodiments, the light convergence layer further includes a first filling layer, and the first filling layer covers the convex surface.

In some embodiments, the light divergence layer further includes a second filling layer, and the second filling layer covers the convex surface.

In a second aspect, embodiments of the present application provide an OLED display panel that includes a base plate; an emissive layer located on the base plate and including a plurality of light-emitting units; an encapsulation layer located on the emissive layer; a color filter layer located on the encapsulation layer and including a plurality of color filters, wherein the color filters are arranged in one-to-one correspondence with the light-emitting units; and a cover plate located on the color filter layer; wherein a light convergence layer is disposed between the encapsulation layer and the color filter layer, the light convergence layer is made of a light convergence material, the light convergence material has a convergent effect on light from the emissive layer, a light divergence layer is disposed between the color filter layer and the cover plate, the light divergence layer is made of a light divergence material, and the light divergence material has a divergent effect on light from the emissive layer, for increasing brightness and chromaticity of the OLED display panel.

In some embodiments, a refractive index of the light convergence layer is greater than a refractive index of the encapsulation layer and the light divergence layer.

In some embodiments, the light convergence layer includes a plurality of first micro lens structures, the first micro lens structures are arranged in one-to-one correspondence with the light-emitting units, and the first micro lens structures have at least one convex surface.

In some embodiments, the light convergence layer further includes a first filling layer, and the first filling layer covers the convex surface.

In some embodiments, the light divergence layer includes a plurality of second micro lens structures, the second micro lens structures are arranged in one-to-one correspondence with the light-emitting units, and the second micro lens structures have at least one convex surface.

In some embodiments, the light divergence layer further includes a second filling layer, and the second filling layer covers the convex surface.

In some embodiments, the light convergence material includes acrylic polymer and/or epoxy polymer, the acrylic polymer and/or epoxy polymer are doped with metal and/or metal oxide, or the acrylic polymer and/or epoxy polymer are polymerized with metal and/or metal oxide.

In some embodiments, the light divergence material includes fluorinated acrylate, 1,1,1,3,3,3-hexafluoroisopropyl acrylate, poly(2,2,3,3,4,4,4-heptafluorobutyl acrylate), and poly(2,2,3,3,3-pentafluoropropyl acrylate).

In some embodiments, a refractive index of the light convergence layer is greater than or equal to 1.7, and a refractive index of the light divergence layer is less than or equal to 1.5.

In a third aspect, embodiments of the present application provide a manufacturing method of an OLED display panel, and the method includes providing a base plate; providing an emissive layer disposed on the base plate and including a plurality of light-emitting units and a pixel definition layer; providing an encapsulation layer disposed on the emissive layer; providing a light convergence layer disposed on the encapsulation layer, wherein the light convergence layer is made of a light convergence material, and the light convergence material has a convergent effect on light from the emissive layer; providing a color filter layer disposed on the encapsulation layer and including a plurality of color filters and black matrices, wherein the color filters are disposed individually corresponding to the light-emitting units; providing a light divergence layer disposed on the encapsulation layer, wherein the light divergence layer is made of a light divergence material, and the light divergence material has a divergent effect on light from the emissive layer; and providing a cover plate disposed on the color filter layer; wherein the light convergence layer and the light divergence layer use manufacturing processes including coating, inkjet printing, or photolithography.

In some embodiments, a refractive index of the light convergence layer is greater than a refractive index of the encapsulation layer and the light divergence layer.

In some embodiments, the light convergence layer includes a plurality of first micro lens structures, the first micro lens structures are arranged in one-to-one correspondence with the light-emitting units, and the first micro lens structures have at least one convex surface.

In some embodiments, the light convergence layer further includes a first filling layer, and the first filling layer covers the convex surface.

In some embodiments, the light divergence layer includes a plurality of second micro lens structures, the second micro lens structures are arranged in one-to-one correspondence with the light-emitting units, and the second micro lens structures have at least one convex surface.

In some embodiments, the light divergence layer further includes a second filling layer, and the second filling layer covers the convex surface.

In some embodiments, the light convergence material includes acrylic polymer and/or epoxy polymer, the acrylic polymer and/or epoxy polymer are doped with metal and/or metal oxide, or the acrylic polymer and/or epoxy polymer are polymerized with metal and/or metal oxide.

In some embodiments, the light divergence material includes fluorinated acrylate, 1,1,1,3,3,3-hexafluoroisopropyl acrylate, poly(2,2,3,3,4,4,4-heptafluorobutyl acrylate), and poly(2,2,3,3,3-pentafluoropropyl acrylate).

In some embodiments, a refractive index of the light convergence layer is greater than or equal to 1.7, and a refractive index of the light divergence layer is less than or equal to 1.5.

The present application provides an OLED display panel, a light convergence layer is disposed between an encapsulation layer and a color filter layer in the OLED display panel, and a light divergence layer is disposed between the color filter layer and a cover plate. An idea of the present application is that through converging light by the light convergence layer, original light rays with larger angles pass through the color filter layer with smaller angles to alleviate blocking of light by the black matrices, making more light pass through the color filter layer. The light passing through the color filter layer is then diverged by the light divergence layer, thereby increasing brightness and chromaticity of the OLED display panel.

DESCRIPTION OF DRAWINGS

For clearer description of technical approaches of embodiments of the present application, brief description of drawings used to describe the embodiments is provided as follows.

DETAILED DESCRIPTION OF EMBODIMENTS

For better clearness and definiteness of purpose, technical approach, and effect of the present application, the following further describes embodiments of the present application in detail with reference to accompanying drawings. It should be understood that the embodiments described here is merely for explaining the present application and not intended to limit the present application.

In description of the present application, it should be understood that terms that indicates orientation or relation of position such as "center", "longitudinal", "lateral", "length", "width", "thickness", "upper", "lower", "front", "rear", "left", "right", "vertical", "horizontal", "top", "bottom", "interior", "exterior" are based on orientation or relation of position accompanying drawings show. They are simply for purpose of description of the present application and simplifying of description, and do not mean or suggest the devices or components have a specified orientation and constructed and operated in a specified orientation; therefore, it should not be understood as limitation of the present application. Furthermore, terms "first" and "second" are used simply for purpose of description and cannot be understood to mean or suggest relative importance or implicitly mean amount of the technical features. Therefore, features with terms "first" and "second" can mean or implicitly include one or more of the features. In description of the present application, "multiple" means two or more unless otherwise clearly and concretely specified.

Embodiments of the present application provide an organic light-emitting diode (OLED) display panel and manufacturing method thereof, and the following separately describes them in detail. It should be explained that description order of the following embodiments does not limit order of favorableness of the embodiments.

Figure 1:
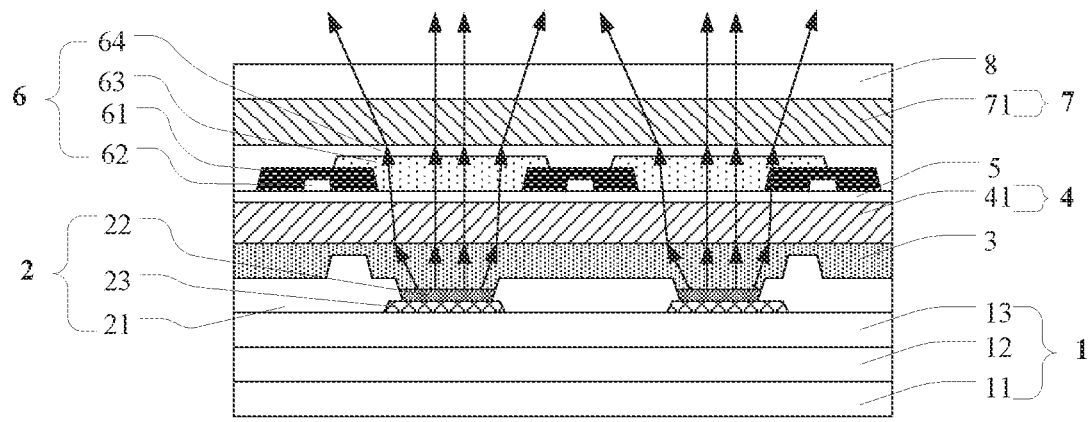
FIG. 1 is a structural schematic diagram of an organic light-emitting diode (OLED) display panel according to an embodiment of the present application.
Figure 2:
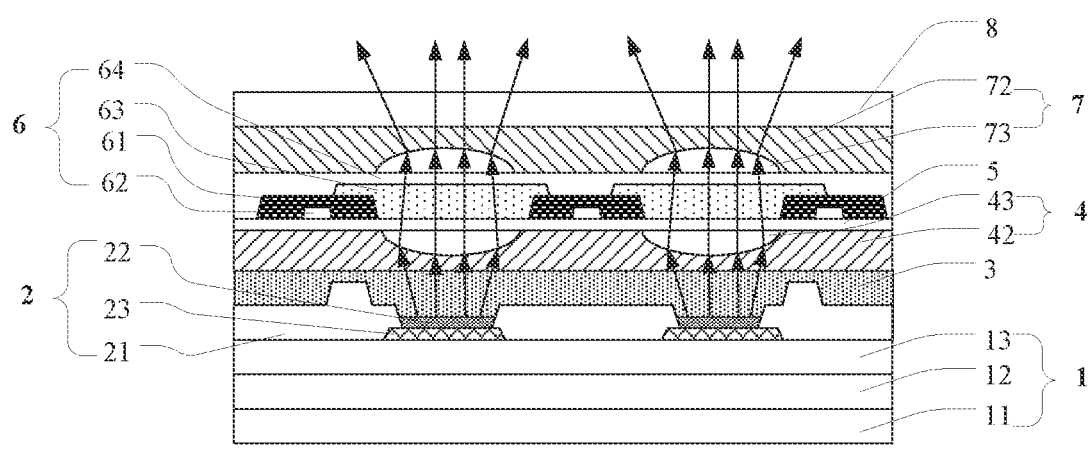
FIG. 2 is a structural schematic diagram of an OLED display panel according to another embodiment of the present application.
Figure 3:
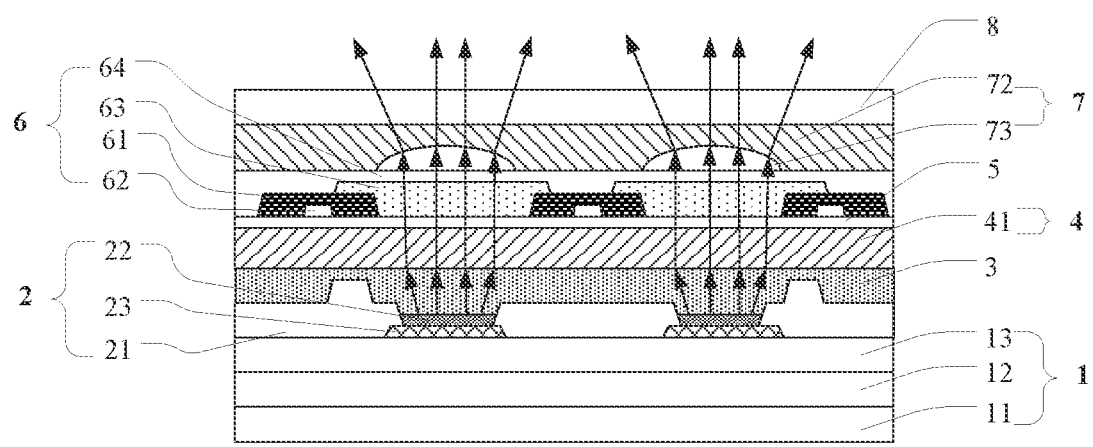
FIG. 3 is a structural schematic diagram of an OLED display panel according to still another embodiment of the present application.

First, referring to FIG. 1 to FIG. 3, embodiments of the present application provide an OLED display panel that includes a base plate 1, an emissive layer 2, an encapsulation layer 3, a color filter layer 6, and a cover plate 8 sequentially stacked from bottom to top. In one embodiment, the emissive layer 2 includes a plurality of light-emitting units 22, the color filter layer 6 includes a plurality of color filters 63 and black matrices 61, and the color filters 63 are arranged in one-to-one correspondence with the light-emitting units 22.

Wherein, a light convergence layer 4 is disposed between the encapsulation layer 3 and the color filter layer 6, the light convergence layer 4 is made of a light convergence material, and the light convergence material has a convergent effect on light from the emissive layer 2. A light divergence layer 7 is disposed between the color filter layer 6 and the cover plate 8, the light divergence layer 7 is made of a light divergence material, and the light divergence material has a divergent effect on light from the emissive layer 2.

Optionally, the base plate 1 includes a substrate 11, underlay 12, and a plurality of thin film transistors (TFTs) 13 disposed on the underlay 12. Wherein, the underlay 12 can be made of any proper flexible or rigid insulation materials like polymer materials such as polyimide (PI), polycarbonate (PC), poly(ether sulfone) (PES), polyethylene terephthalate (PET), polyethylene naphthalate (PEN), polyarylate (PAR), fiber glass reinforced plastic (FRP), etc., or it can be made of glass materials such as glass, tempered glass, etc. The underlay 12 can be transparent, translucent, or opaque.

Optionally, the emissive layer 2 can further include a pixel definition layer 21 and an anode 23, and the pixel definition layer 21 is located on the thin film transistors 13 and covers an edge of the anode 23. The light-emitting units 22 are disposed on the anode 23 and not covered by the pixel definition layer.

Optionally, the encapsulation layer 3 can include a single layer structure or a multi-layered structure of organic and inorganic layers sequentially stacked.

Optionally, the color filter layer 6 can further include a metal mesh 62 covered by the black matrices 61 and an over coat 64 located on the black matrices 61 and the metal mesh 62.

Optionally, an insulator 5 is further disposed between the light convergence layer 4 and the color filter layer 6.

In this way, as shown in FIG. 1 to FIG. 3 (arrows represent light emitted by the emissive layer 2), through converging light by the light convergence layer 4, original light rays with larger angles pass through the color filter layer 6 with smaller angles to alleviate blocking of light by the black matrices 61, making more light pass through the color filter layer 6. The light passing through the color filter layer 6 is then diverged by the light divergence layer 7, thereby increasing brightness and chromaticity of the OLED display panel.

In some embodiments, a refractive index of the light convergence layer 4 is greater than a refractive index of the encapsulation layer 3 and the light divergence layer 7. It should be explained that the light convergence layer 4 and/or the light divergence layer 7 can be a single layer, a double layer, or a multilayer film structure or other structures such as a micro lens structure. That is, any structures that can make the refractive index of the light convergence layer 4 greater than the refractive index of the encapsulation layer 3 and the light divergence layer 7, providing a convergence effect of the light convergence layer 4 and a divergence effect of the light divergence layer 7.

For example, as shown in FIG. 1, the light convergence layer 4 and the light divergence layer 7 are both a coating structure. Wherein, the light convergence layer 4 includes a first coating layer 41, the light divergence layer 7 includes a second coating layer 71, and a refractive index of the first coating layer 41 is greater than the refractive index of the encapsulation layer 3 and the second coating layer 71. According to law of refraction, when light goes from the encapsulation layer 3 into the first coating layer 41, it goes from a medium with a lower refractive index into a medium with a higher refractive index, and refraction angle is less than incidence angle, and therefore the first coating layer 41 has a light convergence effect. When light goes from the first coating layer 41 into the second coating layer 71 through the color filter layer 6, it goes from a medium with a higher refractive index into a medium with a lower refractive index, and refraction angle is greater than incidence angle, and therefore the second coating layer 71 has a light divergence effect.

For example, as shown in FIG. 2, the light convergence layer 4 includes a plurality of first micro lens structures 43, the first micro lens structures 43 are arranged in one-to-one correspondence with the light-emitting units 22, and the first micro lens structures 43 have at least one convex surface.

Optionally, the light convergence layer 4 further includes a first filling layer 42, and the first filling layer 42 covers the convex surface. Specifically, a refractive index of the first filling layer 42 is less than a refractive index of the first micro lens structures 43. When light goes from the first filling layer 42 into the first micro lens structures 43, it goes from a medium with a lower refractive index into a medium with a higher refractive index, and refraction angle is less than incidence angle, and therefore the light convergence layer has a light convergence effect.

Optionally, the first filling layer 42 is an organic insulation layer or inorganic insulation layer material.

It should be explained that the present application does not limit specific convex orientations of the first micro lens structures 43, and FIG. 2 only shows an example where the convex surface of the first micro lens structures 43 faces the encapsulation layer 3. When necessary, the convex surface of the first micro lens structures 43 can also face the color filter layer 6, as long as the first micro lens structures 43 have a light convergence effect.

In this way, when the light convergence layer 4 is implemented by the first micro lens structures 43, in a condition where a material of the light convergence layer 4 remains unchanged, refraction angle can be lesser than incidence angle, the light convergence effect is stronger, more light passes through the color filter layer 6, brightness of the OLED display panel is higher, and display effect is better.

For example, as shown in FIG. 2 and FIG. 3, the light divergence layer 7 includes a plurality of second micro lens structures 73, the second micro lens structures 73 are arranged in one-to-one correspondence with the light-emitting units 22, and the second micro lens structures 73 have at least one convex surface.

Optionally, the light divergence layer 7 further includes a second filling layer 72, the second filling layer 72 covers the convex surface. Specifically, a refractive index of the second filling layer 72 is less than that of the second micro lens structures 73. When light goes from the second micro lens structures 73 into the second filling layer 72, it goes from a medium with a higher refractive index into a medium with a lower refractive index, and refraction angle is greater than incidence angle, and therefore the light divergence layer 7 has a light divergence effect.

Optionally, a material of the second filling layer 72 is optically clear adhesive (OCA).

In this way, when the light divergence layer 7 is implemented by the second micro lens structures 73, in a condition where a material of the light convergence layer 4 remains unchanged, refraction angle can be much greater than incidence angle, the light divergence effect is stronger, view angle chromaticity of the OLED display panel is higher, and display effect is better.

In some embodiments, the light convergence material includes acrylic polymer and/or epoxy polymer. The acrylic polymer and/or epoxy polymer are doped with metal and/or metal oxide, or the acrylic polymer and/or epoxy polymer are polymerized with metal and/or metal oxide.

In some embodiments, the light divergence material includes fluorinated acrylate, 1,1,1,3,3,3-hexafluoroisopropyl acrylate, poly(2,2,3,3,4,4,4-heptafluorobutyl acrylate), and poly(2,2,3,3,3-pentafluoropropyl acrylate).

In some embodiments, a refractive index of the light convergence layer 4 is greater than or equal to 1.7, and a refractive index of the light divergence layer 7 is less than or equal to 1.5. In a specific embodiment, the refractive index of the first micro lens structures 43 is greater than or equal to 1.7, and a refractive index of the second micro lens structures 73 is less than or equal to 1.5.

It can be understood that the refractive index of the light convergence layer 4 can be any value greater than or equal to 1.7, such as 1.7, 1.8, 1.9, 2.0, 2.5, 3.0, 3.5, 4.0, 4.5, 5.0, 6.0, 6.5, 7, 8, 9, or 10. Above refractive indexes are some examples, and in other embodiments of the present application, other refractive indexes can also be adopted, such as 10.

It can be understood that the refractive index of the light divergence layer 7 can be any value less than or equal to 1.5, such as 0.1, 0.2, 0.4, 0.6, 0.8, 1.0, 1.2, 1.4, or 1.5. Above refractive indexes are some examples, and in other embodiments of the present application, other refractive indexes can also be adopted, such as 1.3.

The OLED display panel according to embodiments of the present application has various applications, such as to wearable devices like a smart wristband, a smartwatch, virtual reality (VR). It can also be applied to mobile phones, e-book readers and e-newspaper, televisions, laptops, foldable or rollable flexible OLED displays, lighting equipment, etc. When the OLED display panel according to the present embodiments is applied, they have higher brightness and chromaticity to improve display effect of the devices.

Embodiments of the present application provide an OLED display panel, a light convergence layer 4 is disposed between an encapsulation layer 3 and a color filter layer 6 in the OLED display panel, and a light divergence layer 7 is disposed between the color filter layer 6 and a cover plate 8. An idea of the present application is that through converging light by the light convergence layer 4, original light rays with larger angles pass through the color filter layer 6 with smaller angles to alleviate blocking of light by the black matrices 61, making more light pass through the color filter layer 6. The light passing through the color filter layer 6 is then diverged by the light divergence layer 7, thereby increasing brightness and chromaticity of the OLED display panel.

For better understanding of the present application, on the basis of the above-described embodiments, embodiments of the present application further provide a manufacturing method of an OLED display panel, and the method includes forming sequentially from bottom to top a base plate 1, an emissive layer 2, an encapsulation layer 3, a color filter layer 6, and a cover plate 8. In one embodiment, the emissive layer 2 includes a plurality of light-emitting units 22 and a pixel definition layer 21. The color filter layer 6 includes a plurality of color filters 63 and black matrices 61, and the color filters 63 are arranged in one-to-one correspondence with the light-emitting units 22.

Wherein, a light convergence layer 4 is formed between the encapsulation layer 3 and the color filter layer 6, the light convergence layer 4 is made of a light convergence material, and the light convergence material has a convergent effect on light from the emissive layer 2. A light divergence layer 7 is formed between the color filter layer 6 and the cover plate 8, the light divergence layer 7 is made of a light divergence material, and the light divergence material has a divergent effect on light from the emissive layer 2.

The light convergence layer 4 and the light divergence layer use manufacturing processes such as coating, inkjet printing, or photolithography.

For example, a manufacturing process of the light convergence layer 4 in the OLED display panel as shown in FIG. 3 includes coating an organic insulation layer or plating an inorganic insulation layer on an encapsulation layer 3 as a first filling layer 42, etching an inverted arc structure when metal mesh is patterned, and filling the inverted arc structure with a high refractive index material by coating or inkjet printing to form the second micro lens structures 73. A manufacturing process of the light divergence layer 7 includes: forming the second micro lens structures 73 with a low refractive index material by inkjet printing or photolithography.

In this way, because the OLED display panel does not need complicated film layer structures, manufacturing complexity is decreased, and cost of production can be significantly decreased for mass production. Furthermore, the light convergence layer 4 and the light divergence layer 7 can be manufactured by coating, inkjet printing, or photolithography. With a simple manufacturing process, cost of production can also be significantly decreased for mass production.

It should be explained that in embodiments of the present application, manufacturing methods of the base plate 1, the emissive layer 2, the encapsulation layer 3, the color filter layer 6, and the cover plate 8 can adopt conventional ways in the field, and detailed description is omitted here.

The OLED display panel of the manufacturing method of the OLED display panel includes the OLED display panel according to any one of the above-described embodiments, and detailed description is omitted here.

In summary, the present application provides an OLED display panel and manufacturing method thereof, a light convergence layer 4 is disposed between an encapsulation layer 3 and a color filter layer 6 in the OLED display panel, and a light divergence layer 7 is disposed between the color filter layer 6 and a cover plate 8. An idea of the present application is that through converging light by the light convergence layer 4, original light rays with larger angles pass through the color filter layer 6 with smaller angles to alleviate blocking of light by the black matrices 61, making more light pass through the color filter layer 6. The light passing through the color filter layer 6 is then diverged by the light divergence layer 7, thereby increasing brightness and chromaticity of the OLED display panel. Because the OLED display panel does not need complicated film layer structures, complexity of the manufacturing method of the OLED display panel is decreased, and cost of production can be significantly decreased for mass production. Furthermore, the light convergence layer 4 and the light divergence layer 7 can be manufactured by coating, inkjet printing, or photolithography. With a simple manufacturing process, cost of production can also be significantly decreased for mass production.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application.

Accordingly, such modifications are considered within the scope of the application as limited solely by the appended claims.

What is claimed is:

1. An organic light-emitting diode (OLED) display panel, comprising:
   a base plate;
   an emissive layer located on the base plate and comprising a plurality of light-emitting units;
   an encapsulation layer located on the emissive layer;
   a color filter layer located on the encapsulation layer and comprising a plurality of color filters, wherein the color filters are arranged in one-to-one correspondence with the light-emitting units; and
   a cover plate located on the color filter layer;
   wherein a light convergence layer is disposed between the encapsulation layer and the color filter layer, the light convergence layer is made of a light convergence material, the light convergence material has a convergent effect on light from the emissive layer, a light divergence layer is disposed between the color filter layer and the cover plate, the light divergence layer is made of a light divergence material, and the light divergence material has a divergent effect on light from the emissive layer;
   wherein a refractive index of the light convergence layer is greater than a refractive index of the encapsulation layer and the light divergence layer;
   wherein the light convergence layer comprises a plurality of first micro lens structures, the first micro lens structures are arranged in one-to-one correspondence with the light-emitting units, and the first micro lens structures have at least one convex surface; and
   wherein the light divergence layer comprises a plurality of second micro lens structures, the second micro lens structures are arranged in one-to-one correspondence with the light-emitting units, and the second micro lens structures have at least one convex surface,
   wherein the light convergence layer comprises a first filling layer, and the first filling layer covers convex surfaces of the first micro lens structures, a side of the first filling layer away from the color filter layer is a flat surface, refractive index of the first filling layer is less than refractive index of the first micro lens structures.

2. The OLED display panel as claimed in claim 1, wherein the light divergence layer comprises a second filling layer, and the second filling layer covers the convex surface.

3. An organic light-emitting diode (OLED) display panel, comprising:
   a base plate;
   an emissive layer located on the base plate and comprising a plurality of light-emitting units;
   an encapsulation layer located on the emissive layer;
   a color filter layer located on the encapsulation layer and comprising a plurality of color filters, wherein the color filters are arranged in one-to-one correspondence with the light-emitting units; and
   a cover plate located on the color filter layer;
   wherein a light convergence layer is disposed between the encapsulation layer and the color filter layer, the light convergence layer is made of a light convergence material, the light convergence material has a convergent effect on light from the emissive layer, a light divergence layer is disposed between the color filter layer and the cover plate, the light divergence layer is made of a light divergence material, and the light divergence material has a divergent effect on light from the emissive layer,
   wherein a refractive index of the light convergence layer is greater than a refractive index of the encapsulation layer and a refractive index of the light divergence layer,
   wherein the light convergence layer comprises a plurality of first micro lens structures, the first micro lens structures are arranged in one-to-one correspondence with the light-emitting units, and the first micro lens structures have at least one convex surface,
   wherein the light convergence layer comprises a first filling layer, and the first filling layer covers convex surfaces of the first micro lens structures, a side of the first filling layer away from the color filter layer is a flat surface, refractive index of the first filling layer is less than refractive index of the first micro lens structures.

4. The OLED display panel as claimed in claim 3, wherein the light divergence layer comprises a plurality of second micro lens structures, the second micro lens structures are arranged in one-to-one correspondence with the light-emitting units, and the second micro lens structures have at least one convex surface.

5. The OLED display panel as claimed in claim 4, wherein the light divergence layer comprises a second filling layer, and the second filling layer covers the convex surface.

6. The OLED display panel as claimed in claim 3, wherein the light convergence material comprises acrylic polymer and/or epoxy polymer, the acrylic polymer and/or epoxy polymer are doped with metal and/or metal oxide, or the acrylic polymer and/or epoxy polymer are polymerized with metal and/or metal oxide.

7. The OLED display panel as claimed in claim 3, wherein the light divergence material comprises fluorinated acrylate, 1,1,1,3,3,3-hexafluoroisopropyl acrylate, poly(2,2,3,3,4,4,4-heptafluorobutyl acrylate), and poly(2,2,3,3,3-pentafluoropropyl acrylate).

8. The OLED display panel as claimed in claim 3, wherein a refractive index of the light convergence layer is greater than or equal to 1.7, and a refractive index of the light divergence layer is less than or equal to 1.5.

9. A manufacturing method of an organic light-emitting diode (OLED) display panel, comprising following steps:
   providing a base plate;
   providing an emissive layer disposed on the base plate and comprising a plurality of light-emitting units and a pixel definition layer;
   providing an encapsulation layer disposed on the emissive layer;
   providing a light convergence layer disposed on the encapsulation layer, wherein the light convergence layer is made of a light convergence material, and the light convergence material has a convergent effect on light from the emissive layer;
   providing a color filter layer disposed on the encapsulation layer and comprising a plurality of color filters, wherein the color filters are arranged in one-to-one correspondence with the light-emitting units;
   providing a light divergence layer disposed on the encapsulation layer, wherein the light divergence layer is made of a light divergence material, and the light divergence material has a divergent effect on light from the emissive layer; and
   providing a cover plate disposed on the color filter layer;

wherein a refractive index of the light convergence layer is greater than a refractive index of the encapsulation layer and a refractive index of the light divergence layer, wherein the light convergence layer comprises a plurality of first micro lens structures, the first micro lens structures are arranged in one-to-one correspondence with the light-emitting units, and the first micro lens structures have at least one convex surface, wherein the light convergence layer comprises a first filling layer, and the first filling layer covers convex surfaces of the first micro lens structures, a side of the first filling layer away from the color filter layer is a flat surface, refractive index of the first filling layer is less than refractive index of the first micro lens structures, wherein the light convergence layer and the light divergence layer use manufacturing processes including coating, inkjet printing, or photolithography.

10. The manufacturing method as claimed in claim 9, wherein the light divergence layer comprises a plurality of second micro lens structures, the second micro lens structures are arranged in one-to-one correspondence with the light-emitting units, and the second micro lens structures have at least one convex surface.

11. The manufacturing method as claimed in claim 10, wherein the light divergence layer comprises a second filling layer, and the second filling layer covers the convex surface.

12. The manufacturing method as claimed in claim 9, wherein the light convergence material comprises acrylic polymer and/or epoxy polymer, the acrylic polymer and/or epoxy polymer are doped with metal and/or metal oxide, or the acrylic polymer and/or epoxy polymer are polymerized with metal and/or metal oxide.

13. The manufacturing method as claimed in claim 9, wherein the light divergence material comprises fluorinated acrylate, 1,1,1,3,3,3-hexafluoroisopropyl acrylate, poly(2,2,3,3,4,4-heptafluorobutyl acrylate), and poly(2,2,3,3,3-pentafluoropropyl acrylate).

* * * * *